(12) United States Patent
Meunier-Beillard et al.

(10) Patent No.: US 7,825,011 B2
(45) Date of Patent: Nov. 2, 2010

(54) METHOD OF MANUFACTURING A SEMICONDUCTOR DEVICE AND SEMICONDUCTOR DEVICE OBTAINED BY MEANS OF SAID METHOD

(75) Inventors: Philippe Meunier-Beillard, Kortenberg (BE); Jan Sonsky, Leuven (BE)

(73) Assignee: NXP B.V., Eindhoven (NL)

( * ) Notice: Subject to any disclaimer, the term of this patent is extended or adjusted under 35 U.S.C. 154(b) by 119 days.

(21) Appl. No.: 11/913,255

(22) PCT Filed: Apr. 28, 2006

(86) PCT No.: PCT/IB2006/051329

§ 371 (c)(1),
(2), (4) Date: Oct. 7, 2008

(87) PCT Pub. No.: WO2006/117734

PCT Pub. Date: Nov. 9, 2006

(65) Prior Publication Data

US 2009/0072351 A1    Mar. 19, 2009

(30) Foreign Application Priority Data

May 3, 2005  (EP) ................................. 05103679

(51) Int. Cl.
*H01L 21/20* (2006.01)
*H01L 21/36* (2006.01)

(52) U.S. Cl. ........................ 438/478; 438/455; 438/456

(58) Field of Classification Search .................. 257/620, 257/E21.238, E23.141, 615, E29.089; 438/478, 438/455–456
See application file for complete search history.

(56) References Cited

U.S. PATENT DOCUMENTS

2002/0025636 A1  2/2002  Ju
2004/0242006 A1  12/2004  Bedell et al.

OTHER PUBLICATIONS

Tezuka, T; et al "Fabrication of a Strained is on Sub-10-MM-Thick SiGe-on-Insulator Virtual Substrate" Materials Science and Engineering B, Elsevier Sequoia, Lausanne, CH, vol. 89, No. 1-3, Feb. 14, 2002, pp. 360-363.

*Primary Examiner*—N Drew Richards
*Assistant Examiner*—Mamadou Diallo

(57) ABSTRACT

The invention relates to a method of manufacturing a semiconductor device (10) comprising a substrate (11) and a semiconductor body (12) in which at least one semiconductor element (1) is formed, wherein on the substrate (11) a semiconductor layer (2) is formed comprising a mixed crystal of silicon and germanium, further called the silicon-germanium layer (2) and having a lower surface close to the substrate (11) and an upper surface more remote from the substrate (11), and wherein the silicon-germanium layer (2) is subjected to an oxidizing treatment at a surface of the silicon-germanium layer (2) while the other surface of the silicon-germanium layer (2) is protected against the oxidizing treatment by a blocking layer (3). According to the invention, the blocking layer (3) is formed on the upper surface of the silicon-germanium layer (2), a cavity (5) is formed in the semiconductor body below the silicon-germanium layer (2) and the lower surface of the silicon-germanium layer (2) is subjected to the oxidizing treatment through the cavity (2). In this way, a device 10 may be obtained in which the surface of the silicon-germanium layer (2) after the oxidizing treatment does not suffer from roughening and/or germanium pile up. This enables e.g. to manufacture in particular a MOSFET on top of or in the silicon-germanium layer (2) with excellent properties and high yield.

16 Claims, 5 Drawing Sheets

Figure 1:
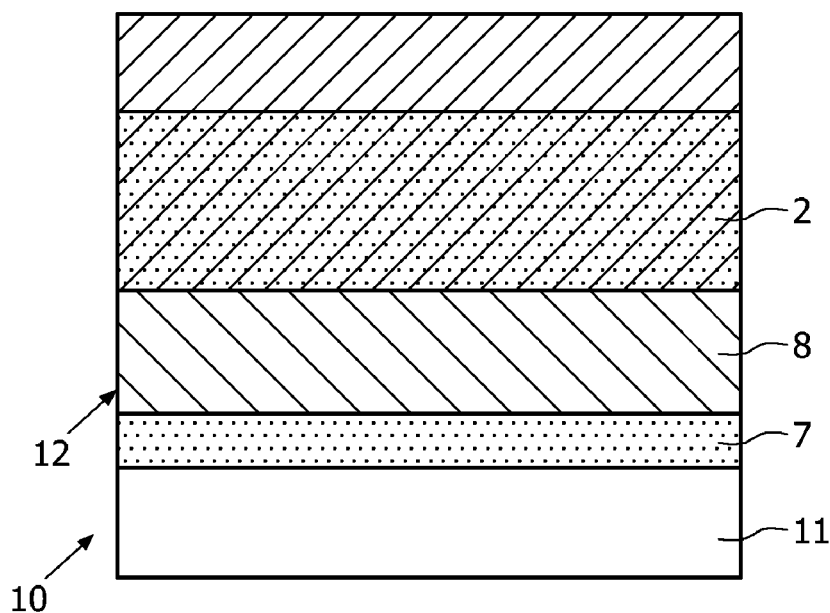
Figure 2:
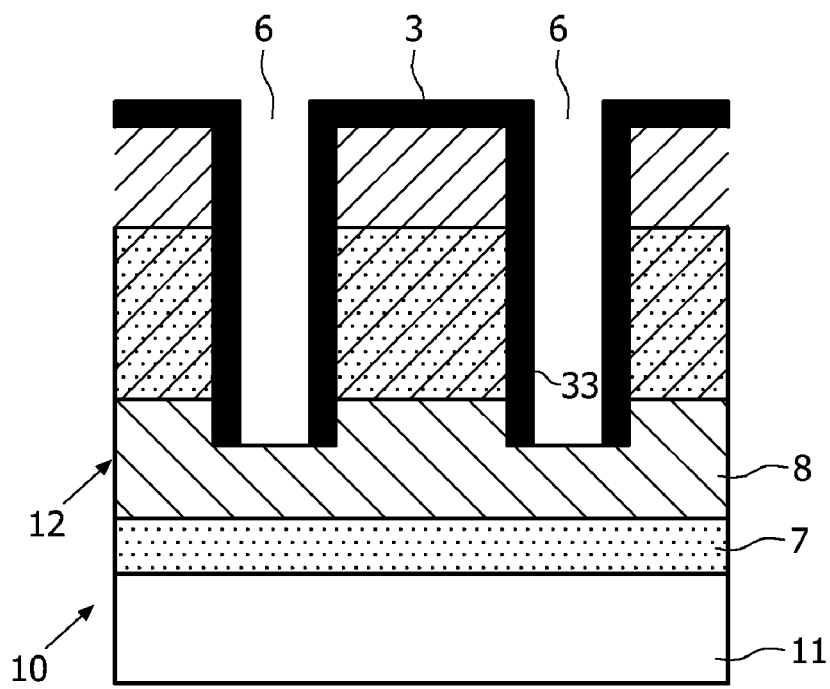
Figure 3:
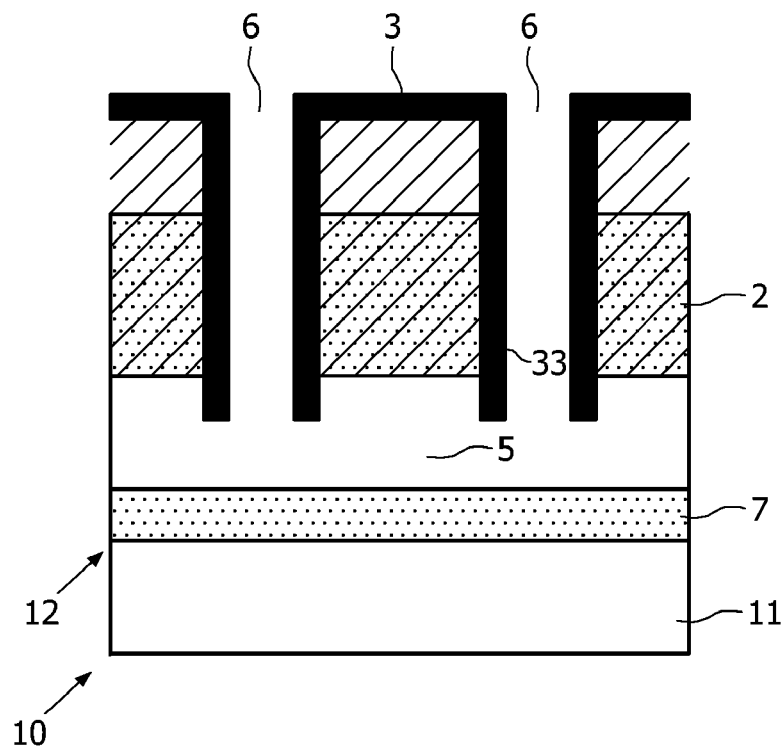
Figure 4:
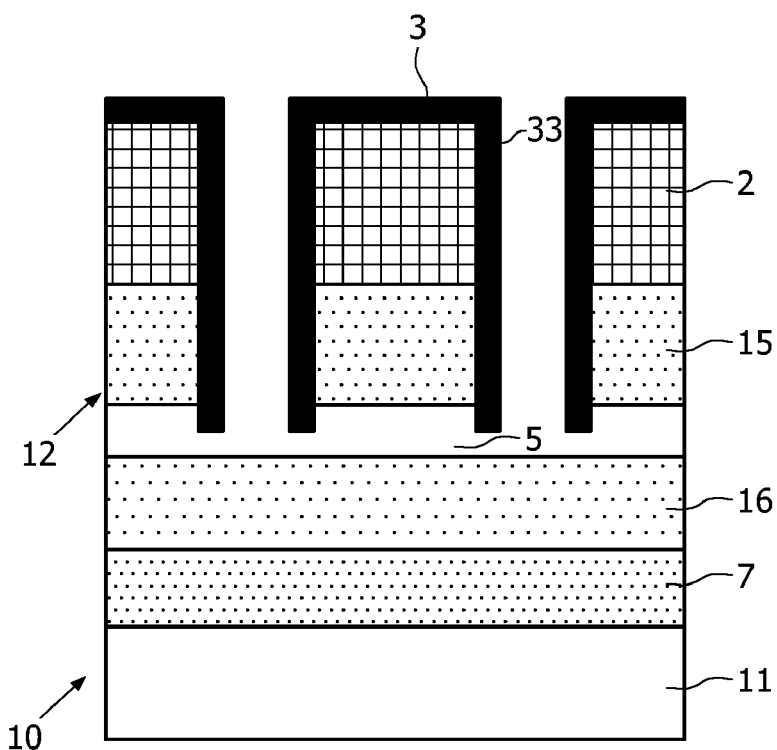
Figure 5:
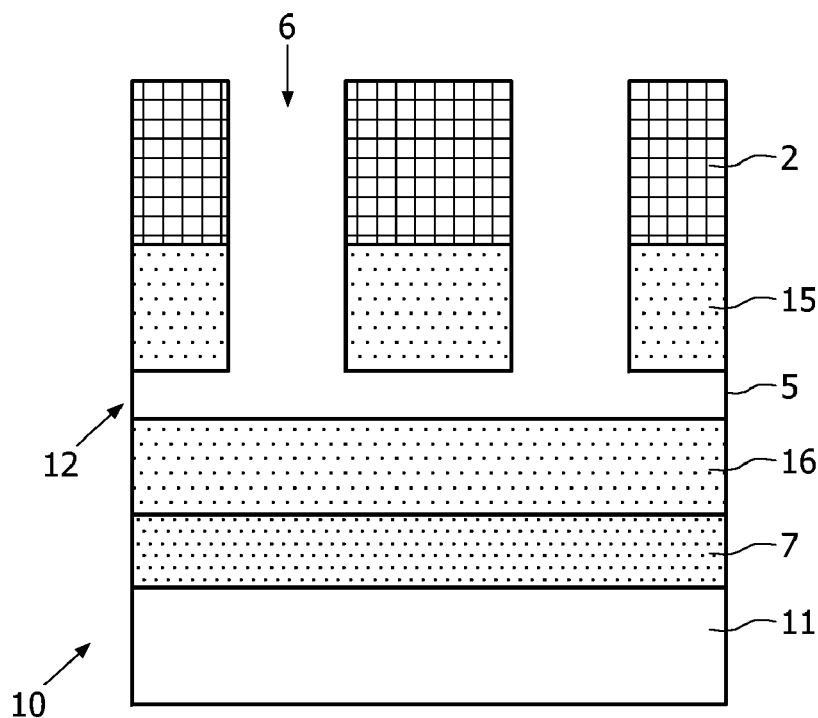
Figure 6:
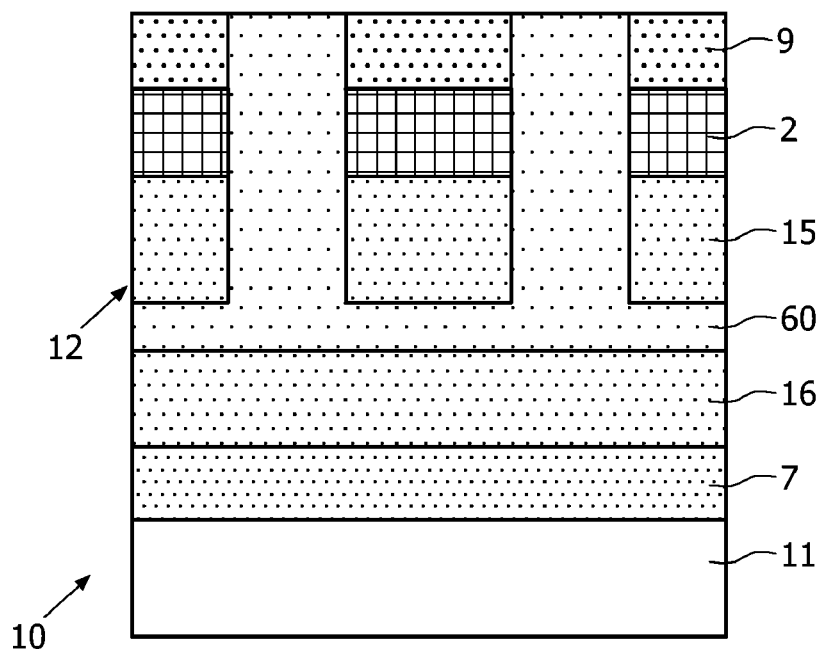
Figure 7:
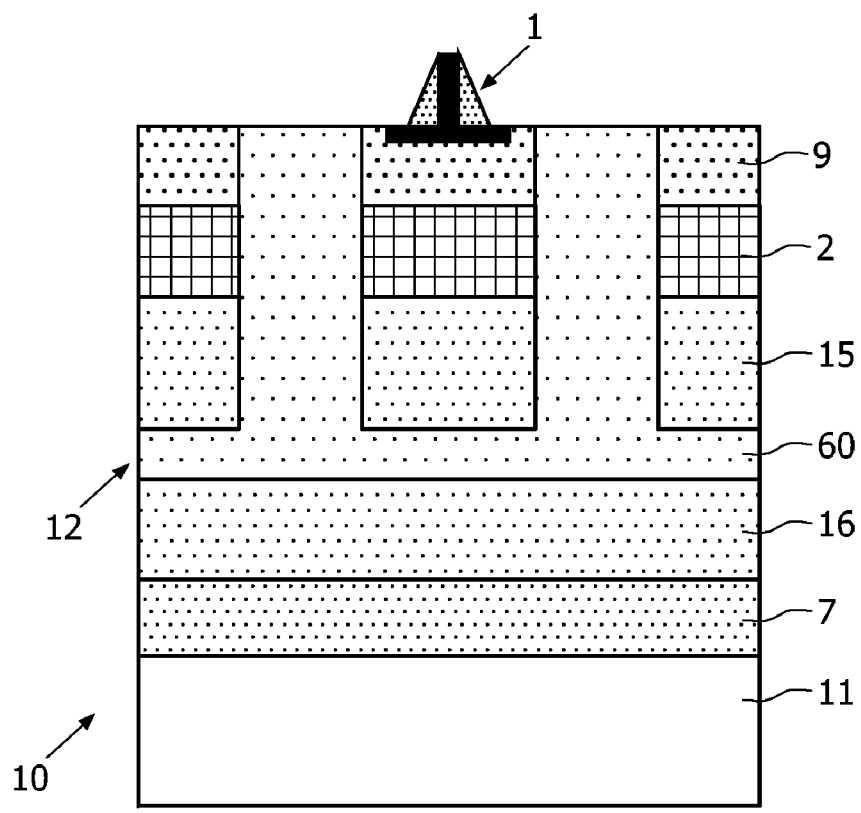

METHOD OF MANUFACTURING A SEMICONDUCTOR DEVICE AND SEMICONDUCTOR DEVICE OBTAINED BY MEANS OF SAID METHOD

The invention relates to a method of manufacturing a semiconductor device comprising a substrate and a semiconductor body in which at least one semiconductor element is formed, wherein on the substrate a semiconductor layer is formed comprising a mixed crystal of silicon and germanium, further called the silicon-germanium layer, and having a lower surface close to the substrate and an upper surface more remote from the substrate, and wherein the silicon-germanium layer is subjected to an oxidizing treatment at a surface of the silicon-germanium layer while the other surface of the silicon-germanium layer is protected against the oxidizing treatment by a blocking layer. By the oxidizing treatment the germanium content of the silicon-germanium layer is increased due to the fact that germanium is rejected from the silicon(di)oxide layer formed at the surface subjected to the oxidizing treatment and is brought into the remainder of the silicon-germanium layer. Such a layer having in this way an increased germanium content is useful in the manufacture of several semiconductor devices. It is to be noted that on the one hand the blocking layer protects the silicon-germanium layer against the oxidizing treatment and on the other hand prevents germanium atoms from leaving the silicon-germanium layer at the side where the blocking layer is present. A method of the type mentioned in the opening paragraph is known from the publication entitled "Fabrication of strained Si on ultra thin SiGe-on-insulator virtual substrate with a high-Ge fraction" by T. Tezuka et al. that has been published in Applied Physics Letters volume 79, number 12, 17 Sep. 2001, pp 1798-1800. In this publication a method is described in which a strained silicon-germanium layer which is deposited on a SOI (=Silicon On Insulator) wafer is oxidized in an oxygen-containing atmosphere above 1000 degree Celsius. The lower surface of the silicon-germanium layer is protected against said oxidizing treatment by the presence of a thin silicon layer below the silicon-germanium layer and in particular by the presence of the silicon(di)oxide layer present below said thin silicon layer. Since germanium is repelled from the oxide layer formed by oxidizing the silicon-germanium layer, the germanium content of the remaining part of the silicon-germanium layer is increased by this method. Because of the high temperature, the germanium from the SiGe layer will diffuse into the Si layer of the SOI wafer and this results in a single SiGe layer. It is mentioned that this method is in particular suitable for obtaining SGOI (=Silicon Germanium On Insulator) structures with a high germanium content since growth of silicon-germanium layers with larger germanium fractions, e.g. above 30 at. % germanium, are difficult to obtain by epitaxy of such a layer on a SOI substrate because the large mismatch involved causes surface roughening and dislocations during annealing. A relaxed silicon-germanium layer having a high germanium content is however desirable for e.g. a large mobility enhancement in particular in p-MOS-FETs (=Metal Oxide Semiconductor Field Effect Transistors) containing devices.

A drawback of the known method resides in that it appeared to be less suitable for the manufacturing of e.g. advanced CMOS (=Complementary MOS) devices. In particular the yield of such devices with very small dimensions is not high enough.

Therefore it is an object of the present invention to provide a method of the type mentioned in the opening paragraph, which is suitable for manufacturing advanced semiconductor devices, in particular CMOS devices, with a high yield and which is moreover simple.

To achieve this, a method of the type mentioned in the opening paragraph is characterized in accordance with the invention in that the blocking layer is formed on the upper surface of the silicon-germanium layer, a cavity is formed in the semiconductor body below the silicon-germanium layer and the lower surface of the silicon-germanium layer is subjected to the oxidizing treatment through the cavity. The invention is based on the recognition that the relatively low yield is caused by surface roughening and defect formation near the active region of very small FETs, i.e. close to or within the channel formed in the channel region below the gate electrode of such devices.

The invention is further based on the recognition that said surface roughening is caused by the oxidizing treatment and that in the known method said roughened surface is within the channel region of a FET after the necessary removal of the oxide layer formed by the oxidizing treatment. The invention is further based on the recognition that performing the oxidizing treatment from the other side of the silicon-germanium layer implies that the roughened surface is more remote from the active region of semiconductor devices formed on top of or in the silicon-germanium layer having the increased germanium content. Finally, the invention is based on the recognition that such a backside oxidizing treatment is possible on the one hand by forming a cavity below the silicon-germanium layer and on the other hand by depositing an oxidation blocking layer on top of the silicon-germanium layer. Such a layer can easily be removed afterwards. An additional advantage of the method according to the invention is that by this method a germanium pile up near the active region of a semiconductor device is also avoided, whereas such a pile up may easily occur in the known method. Such a pile-up of germanium is detrimental for the properties of a semiconductor device like a FET because the locally higher Ge content creates an unwanted channel (bandgap offset) and because an in this way increased germanium content makes the layer rougher.

In a preferred embodiment a hole is etched in the silicon-germanium layer with a depth greater than the thickness of the silicon-germanium layer and the cavity is formed by under etching material below the silicon-germanium layer with a selective etching agent. In this way a cavity below the silicon-germanium layer can easily be formed. Moreover, it can be formed locally. In this way, on the one hand locations can be selected for forming the cavity and on the other hand the silicon-germanium layer will still be supported where necessary. An additional advantage of a method according to this embodiment is that it is relatively simple, in particular if a cavity is formed below certain semiconductor elements because no additional mask is needed for protecting other elements/locations. The mask used for forming the hole(s and cavity) can be chosen accordingly.

In a further embodiment for the substrate a silicon substrate is chosen and the silicon-germanium layer is formed by epitaxy. An important advantage of a method according to the invention is that it is very suitable for forming the desired elements in a structure mostly used in IC (=Integrated Circuits) formation, i.e. a semiconductor body formed by a silicon substrate with one or more epitaxial layers on top thereof.

In a modification a further silicon-germanium layer is formed below the silicon-germanium layer, which is separated from the silicon-germanium layer by a silicon layer. In this way a cavity can be easily formed in a structure containing a silicon substrate by etching the silicon, which forms an intermediate layer between the two silicon-germanium layers, selectively with respect to said silicon-germanium layers.

Preferably the silicon-germanium layer is provided with a thickness larger than the thickness of the further silicon-germanium layer. In this way, the silicon-germanium layer can become a completely relaxed layer which is suitable for (locally) forming e.g. a strained silicon layer on top thereof for forming e.g. n-type MOSFET devices having said strained silicon layer in its channel region.

In another favorable embodiment an insulating layer is formed in the silicon substrate below a thin surface layer of silicon. The method according to the invention in this way is also suitable for forming devices in a so-called SGOI structure. In this case the cavity may be formed—after formation of a hole(s) in the silicon-germanium layer by selectively etching the insulating layer, e.g. of a silicon-oxide, with respect to the silicon of the bordering silicon regions (the thin surface layer and the remainder of the silicon substrate). Afterwards, before the oxidizing treatment, the thin surface layer of silicon, which covers the lower surface of the silicon-germanium layer, may be removed by an etchant of silicon, which is selective with respect to silicon-germanium.

As explained before, the method according to the invention is particularly suitable for forming semiconductor devices in which the semiconductor element is a field effect transistor. Either strained silicon (on relaxed silicon-germanium) or relaxed silicon-germanium having a high germanium content can be used e.g. for a N-MOSFET and a P-MOSFET respectively in a CMOS device. An important advantage of a method according to the present invention is that (at least a part of) a semiconductor element, e.g. a field effect transistor, can be formed before the oxidizing treatment. This is caused by the fact that the oxidizing treatment is performed from below and does not interfere with the surface of the semiconductor body and with semiconductor elements present thereon/therein. In this way, the transistor formation is better since fabricating a gate dielectric and a gate on a pure germanium or silicon layer with a very high germanium content is very difficult. This is avoided if the gate dielectric and gate are formed on a silicon layer or silicon-germanium layer with a low germanium content and the germanium layer or silicon-germanium layer with high germanium content is formed only thereinafter.

As mentioned before the silicon-germanium layer having a high germanium content may be provided (locally) with a thin silicon layer or a III-V layer. This broadens the scope of semiconductor elements that can be integrated in the device. By use of a III-V layer several opto-electronic devices like power and RF (=Radio Frequency) devices, phototransistors, photodiodes, LEDs (=Light Emitting Diodes) and lasers may be integrated advantageously.

Preferably, after the oxidizing treatment the cavity is filled with polycrystalline or amorphous silicon. In this way the heat conductance is improved and possibly remaining stress can be released.

A suitable layer for use as a blocking layer is a layer of silicon nitride. However, also a layer of silicon dioxide can be used for this purpose or a stack of thin alternating layers of silicon nitride and silicon dioxide. Preferably said blocking layer is deposited before the hole(s) are made in the silicon-germanium layer for forming the cavity below the latter layer.

Preferably, the oxidizing treatment is performed by using an atmosphere containing oxygen (O2) at a temperature above about 1000 degrees Celsius.

The invention further comprises a semiconductor device obtained by means of a method in accordance with the invention.

These and other aspects of the invention are apparent from and will be elucidated with reference to the embodiments described hereinafter.

Figure 8:
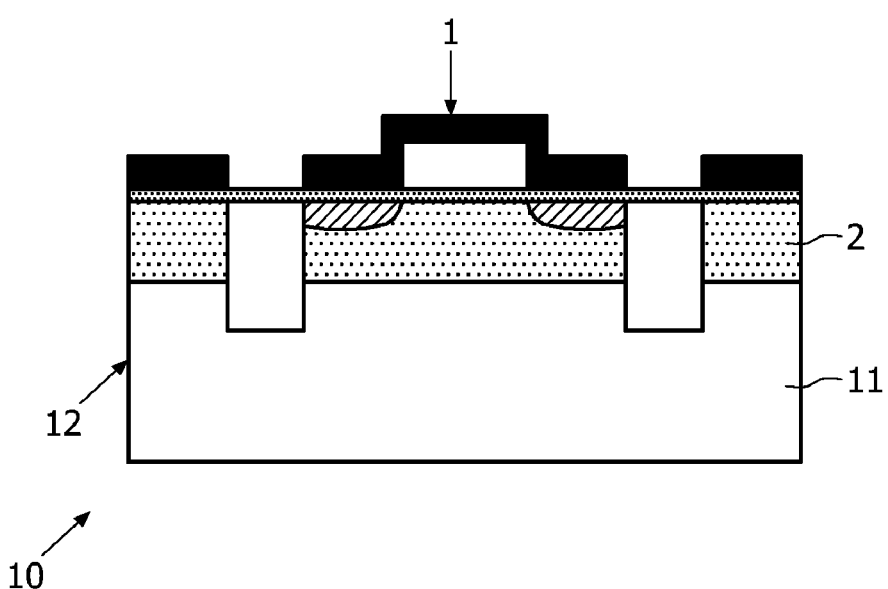
Figure 9:
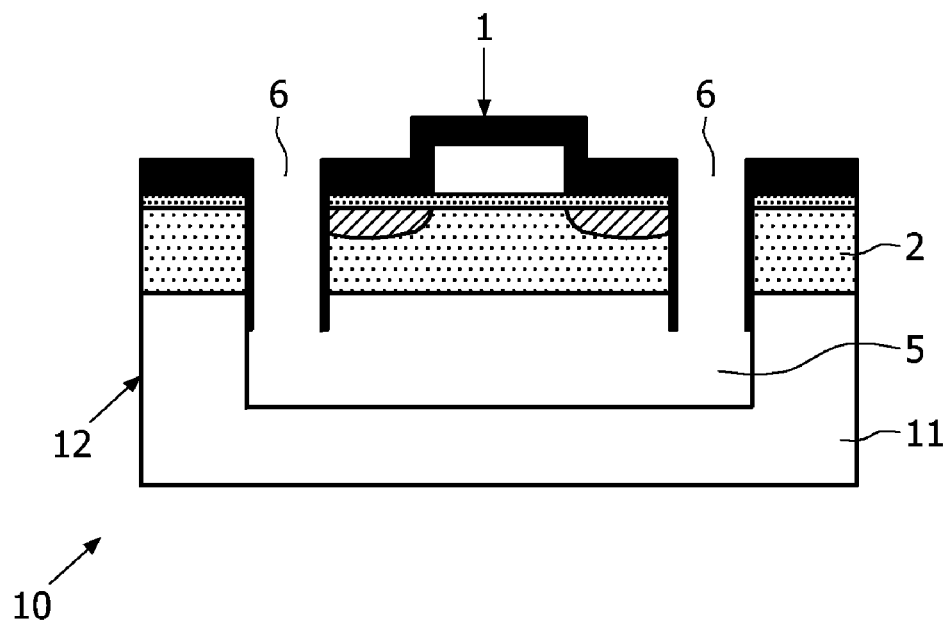
Figure 10:
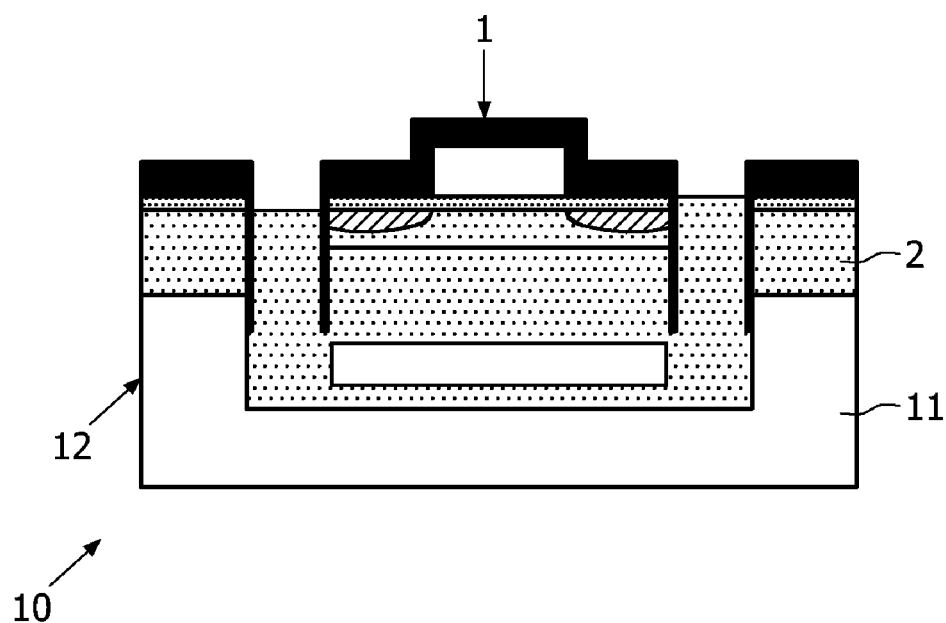

In the drawings:

FIGS. 1 through 7 are diagrammatic and cross-sectional views, at right angles to the thickness direction, of a semiconductor device in successive stages of the manufacture by means of a first embodiment of a method in accordance with the invention, and FIGS. 8 through 10 are diagrammatic and cross-sectional views, at right angles to the thickness direction, of another semiconductor device in successive stages of the manufacture by means of a second embodiment of a method in accordance with the invention.

The Figures are not drawn to scale and some dimensions, such as dimensions in the thickness direction, are exaggerated for clarity. Corresponding regions or parts in the various Figures are indicated by means of the same hatching or the same reference numerals whenever possible.

FIGS. 1 through 7 are both diagrammatic and cross-sectional views, at right angles to the thickness direction, of a semiconductor device in successive stages of the manufacture by means of an embodiment of a method in accordance with the invention. The starting element used in the formation of the device 10 (see FIG. 1) is a semiconductor body 12 comprising a substrate 11, in this case a semiconductor substrate of silicon. A first epitaxial layer 7 is provided thereon by means of epitaxy, which epitaxial layer comprises a mixed crystal of silicon and germanium, and on said epitaxial layer there is provided an epitaxial-silicon layer 8 which in turn is provided with an epitaxial mixed-crystal layer 2 of silicon and germanium. The thickness of the layers 7, 8, 2 is 20 nm, 230 nm and 70 nm respectively. The germanium content of the silicon-germanium layers 7,2 is 20 at. %.

Subsequently (see FIG. 2) holes 6 are formed in the silicon-germanium layer 2 by means of etching, e.g. by a dry etching process. A hard mask layer 3, e.g. of silicon nitride, may be used for this purpose and in any case use is made of photolithography and etching. The holes 6 may be e.g. strip shaped and run parallel to each other and their length may be chosen to be at least equal to the size of a semiconductor element to be formed between the holes 6. The depth of the holes 6 is chosen to be at least equal to the thickness of the silicon-germanium layer 2. Next spacers 33 are formed on the walls of the holes 6 by means of a deposition technique like CVD (=Chemical Vapor Deposition) and in this example the spacer comprise a stack of layers having a 10 nm thick layer of silicon nitride in between two 20 nm thick layers of silicon dioxide.

Next (see FIG. 3) a cavity 5 is formed below the silicon-germanium layer 2 at the location where the semiconductor element is to be formed. This is done by removing a part of the silicon layer 8 between the two silicon-germanium layers 7,2 by means of an etchant like a wet etch of diluted ammonia (10% NH4OH) which etches silicon selective to silicon-germanium.

Subsequently (see FIG. 4), the lower surface of the silicon-germanium layer 2 is subjected to an oxidizing treatment by exposing said surface to an atmosphere containing oxygen at a temperature of 1000 degrees Celsius. In this way an oxide film 15 is formed at the lower surface of the silicon-germanium layer 2. Thanks to the conditions chosen, the germanium-content of the silicon-germanium layer 2 is increased since on the one hand germanium atoms are rejected from the oxide film 15 and on the other hand the masking layer 3 on top of the upper surface of the silicon-germanium layer 2 functions as a (germanium and oxidation) blocking layer. At the same time the thickness of the silicon-germanium layer 2 is decreased. A germanium content of well above 30 at. % can be easily obtained in this way and layer 2 may even become substantially a germanium layer. To indicate this change in the thickness and germanium content of silicon-germanium layer 2, its hatching has been changed as of this Figure. In this process step the lower silicon-germanium layer 7 also is provided with an oxide layer 16. This however is not essential for the method according to the invention. The lower silicon-germanium layer 7 can also be removed since the upper silicon-germanium layer 2 is thicker.

Next, (see FIG. 5), the germanium blocking layer 3 and the spacers 33 are removed by etching using suitable etching solutions. It is to be noted here, that although the layers 3,33 are made separately in this example, it might be feasible that the function of these layers can be performed by a single layer.

Now (see FIG. 6) a thin silicon layer 9 is grown which forms a strained silicon layer on top of the (relaxed) silicon-germanium layer 2 with the high germanium content. Thereinafter the cavity 5 and the holes 6 are filled with a dielectric 60, in this example comprising TEOS (=Tetra Ethyl Ortho Silicate) and HDP (=High Density Plasma) oxide and deposited by means of CVD. It is to be noted that if the strained silicon is grown before filling the cavity, this layer will also be present on the walls of the cavity 5 and the holes 6. This is not shown in the drawing.

Finally (see FIG. 7) a semiconductor element 1, in this example a field effect transistor 1, is formed on top of the strained silicon layer 9. This elements is formed by means of process steps that are in itself well known in the art of (C)MOS technology and will only be shortly described here as forming a gate dielectric, forming a gate electrode, forming spacers on both sides of the gate electrode and forming source and drain regions bordering a channel region in the thin silicon layer 9 on both sides of the gate electrode.

The device 10 may of course be provided with one or more other active and/or passive elements, such as diodes, resistors, coils and capacitors. A suitable pattern of connection conductors and/or bondpads is also formed, and individual semiconductor devices 10, which may comprise a discrete or semi-discrete device 10 or a complex IC, are provided by means of separation techniques such as sawing.

FIGS. 8 through 10 are both diagrammatic and cross-sectional views, at right angles to the thickness direction, of another semiconductor device in successive stages of the manufacture by means of a second embodiment of a method in accordance with the invention. The main differences with the first example are as follows.

Firstly (see e.g. FIG. 8) only a single silicon-germanium layer 2 is deposited on the substrate 11. Thus, the formation of the cavity is not limited in the direction of the substrate 11. However, this is no problem since the thickness of the substrate 11 is much larger than the lateral size of the cavity 5 to be formed.

Secondly (see e.g. FIG. 8) the semiconductor element 1, in this example a field effect transistor 1 as well, is already formed on top of the semiconductor body 12 before holes 6 and cavity 5 (see FIG. 9) are formed and before the lower surface of the silicon-germanium layer 2 is subjected to the oxidizing treatment. The semiconductor element 1 may be formed in the same way as in the previous example.

Finally (see e.g. FIG. 9), after the oxidizing treatment by which the germanium content of the silicon-germanium layer 2 is increased and by which its thickness is reduced, no (further) silicon layer is deposited on top of the silicon-germanium or germanium layer 2. This implies that the gate dielectric of the transistor 1 is directly on top of the silicon-germanium or germanium layer 2 and that the channel region of said transistor 1 is formed in said silicon-germanium or germanium layer.

Other steps of the method of this example may be the same as those described in the previous example, e.g. the filling of holes 6 and cavity 5 by a dielectric (see FIG. 10) and will here not be discussed separately.

The invention is not limited to the exemplary embodiment described above, and within the scope of the invention many variations and modifications are possible to those skilled in the art. For example, devices can be manufactured having features of the devices of both examples, e.g. a CMOS circuit may be manufactured in which the NMOS transistor is manufactures according to the first example and the PMOS transistor is formed as in the second example.

It is to be noted that materials other than those mentioned in the examples may alternatively be used within the scope of the invention. Also other deposition techniques may be used for the above-mentioned materials or other materials, such as epitaxy, CVD (=Chemical Vapor Deposition), sputtering and vaporization. Instead of wet-chemical etching methods use can alternatively be made of "dry" techniques, such as plasma etching, and vice versa.

Finally, it is noted that the device may comprise additional active and passive semiconductor elements or electronic components, such as a larger number of diodes and/or transistors and resistors and/or capacitors, whether or not in the form of an integrated circuit. The manufacturing process is of course efficiently adapted thereto.

The invention claimed is:

1. A method of manufacturing a semiconductor device comprising:
    forming at least one semiconductor element in a substrate and a semiconductor body;
    wherein forming the at least one semiconductor element includes,
        forming a silicon-germanium layer on the substrate, the silicon-germanium layer including a mixed crystal of silicon and germanium, the silicon-germanium layer having a lower surface close to the substrate and an upper surface more remote from the substrate, and subjecting the silicon-germanium layer to an oxidizing treatment at a surface of the silicon-germanium layer while the other surface of the silicon-germanium layer is protected against the oxidizing treatment by a blocking layer,
        the blocking layer formed on the upper surface of the silicon-germanium layer,
    the method further comprising,
        forming a cavity in the semiconductor body below the silicon-germanium layer, and
        through the cavity, subjecting the lower surface of the silicon-germanium layer to an oxidizing treatment.

2. A method according to claim 1, characterized in that a hole is etched in the silicon-germanium layer with a depth greater than the thickness of the silicon-germanium layer and the cavity is formed by under etching material below the silicon-germanium layer with a selective etching agent.

3. A method according to claim 1, characterized in that for the substrate, a silicon substrate is chosen and the silicon-germanium layer is formed by epitaxy.

4. A method according to claim 3, characterized in that a further silicon-germanium layer is formed below the silicon-germanium layer and which is separated from the silicon-germanium layer by a silicon layer.

5. A method according to claim 4, characterized in that the silicon-germanium layer is provided with a thickness larger than the thickness of the further silicon-germanium layer.

6. A method according to claim 3, characterized in that in the silicon substrate an insulating layer is formed below a thin surface layer of silicon.

7. A method according to claim 1, characterized in that for the semiconductor element a field effect transistor is chosen.

8. A method according to claim 7, characterized in that the channel region of the field effect transistor is formed by the silicon-germanium layer.

9. A method according to claim 7, characterized in that the field effect transistor is formed before formation of the cavity.

10. A method according to claim 7, characterized in that a thin silicon layer is formed on top of the silicon-germanium layer.

11. A method according to claim 7, characterized in that a III-V layer is formed on top of the silicon-germanium layer.

12. A method according to claim 1, characterized in that after the oxidizing treatment the cavity is filled by polycrystalline or amorphous silicon.

13. A method according to claim 1, characterized in that the at least one semiconductor element forms a CMOS circuit.

14. A method according to claim 1, characterized in that for the blocking layer a layer of silicon nitride is chosen.

15. A method according to claim 1, characterized in that for the oxidizing treatment an oxidation in an oxygen containing atmosphere at a temperature higher than 1000° C. is chosen.

16. A semiconductor device obtained by a method according to claim 1.

* * * * *